(12) United States Patent
Obukhov et al.

(10) Patent No.: US 10,620,016 B2
(45) Date of Patent: Apr. 14, 2020

(54) MECHANICALLY POWERING SENSORS USING A MAGNETIC FIELD

(71) Applicant: Western Digital Technologies, Inc., San Jose, CA (US)

(72) Inventors: Dmitry Obukhov, San Jose, CA (US); Muthukumar Karuppiah, San Ramon, CA (US); Khurram Ismail, Milpitas, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 145 days.

(21) Appl. No.: 15/822,198

(22) Filed: Nov. 26, 2017

(65) Prior Publication Data

US 2019/0162561 A1 May 30, 2019

(51) Int. Cl.
| | |
|---|---|
| *G01D 5/20* | (2006.01) |
| *H05K 1/18* | (2006.01) |
| *H02N 99/00* | (2006.01) |
| *G01P 3/487* | (2006.01) |
| *G01P 13/04* | (2006.01) |
| *G01D 21/00* | (2006.01) |
| *H04B 1/38* | (2015.01) |

(52) U.S. Cl.
CPC ........... *G01D 5/2006* (2013.01); *G01D 21/00* (2013.01); *G01P 3/487* (2013.01); *G01P 13/045* (2013.01); *H02N 99/00* (2013.01); *H05K 1/181* (2013.01); *H04B 1/38* (2013.01); *H05K 2201/09009* (2013.01); *H05K 2201/10151* (2013.01)

(58) Field of Classification Search
USPC ............................................. 324/207.11, 176
See application file for complete search history.

(56) References Cited

U.S. PATENT DOCUMENTS

| | | | |
|---|---|---|---|
| 6,594,111 B1 | 7/2003 | Oveyssi | |
| 6,741,428 B1 | 5/2004 | Oveyssi | |
| 8,364,312 B2 | 1/2013 | Tobey | |
| 2005/0117602 A1 | 1/2005 | Arms et al. | |
| 2008/0307807 A1* | 12/2008 | Graff | F25D 17/045 62/186 |
| 2008/0307900 A1 | 12/2008 | Paul et al. | |
| 2016/0272019 A1 | 9/2016 | Wang et al. | |

FOREIGN PATENT DOCUMENTS

WO 2016070929 A1 5/2016

OTHER PUBLICATIONS

European Search Report dated Apr. 3, 2019 for Application EP 18196786.

* cited by examiner

*Primary Examiner* — Vincent Q Nguyen
(74) *Attorney, Agent, or Firm* — Chang & Hale LLP

(57) ABSTRACT

A sensing apparatus may include a printed circuit board (PCB) having a processing unit, a positioning sensor, an environmental sensor and one or more inductive elements positioned within a region at an edge of the PCB. The one or more inductive elements may be configured to generate electrical energy for the processing unit by passing through a magnetic field. The apparatus may also include a spindle implemented through the PCB, such that the spindle protrudes through a substantially central location relative to one plane of the PCB.

26 Claims, 11 Drawing Sheets

| SENSOR READING | POSITION OF POSITIONAL SENSOR | POSITION OF ENVIRONMENTAL SENSOR | DIRECTION OF INPUT | TIME |
|---|---|---|---|---|
| 6.5 meters | 0° | 180° | N | 1508981119 |
| 5.4 meters | 45° | 225° | NW | 1508981123 |
| 1.2 meters | 90° | 270° | W | 1508981127 |
| 2.3 meters | 135° | 315° | SW | 1508981131 |
| 3.6 meters | 180° | 0° | S | 1508981135 |
| 4.0 meters | 225° | 45° | SE | 1508981139 |
| 7.8 meters | 270° | 90° | E | 1508981143 |
| 6.5 meters | 315° | 135° | NE | 1508981147 |

*FIG. 3C*

MECHANICALLY POWERING SENSORS USING A MAGNETIC FIELD

BACKGROUND

Field

This disclosure relates to a scanning system for directed and non-directed sensors. More particularly, the disclosure relates to systems, apparatuses and methods for operating and/or communicating data with a mechanically powered scanning platform for sensors taking scalar and/or vector-based readings.

Description of Related Art

Sensors are useful and prevalent tools for taking a wide variety of environmental data and/or communication readings, such as temperature, velocity, acceleration, proximity, flow rate, radiation levels, radio-frequency (RF) communications and electromagnetic (EM) levels.

Sensors are often required to be placed in environmental conditions which provide challenges for providing a power source. Such environmental conditions may also pose risks of damage or destruction to sensitive electronics equipment, sensors and/or circuitry. As such, a need exists to provide sensing equipment capable of being powered and protected under a variety of environmental conditions.

SUMMARY

In accordance with some implementations, the present disclosure relates to an apparatus comprising a printed circuit board (PCB) comprising a controller, a positioning sensor, an environmental sensor and one or more inductive elements positioned within a region at an edge of the PCB. The one or more inductive elements may be configured to generate electrical energy or power for the controller by passing through a magnetic field. The apparatus may further include a spindle implemented through the PCB, such that the spindle protrudes through a substantially central location relative to one plane of the PCB.

In some embodiments, the controller is coupled to the environmental sensor, the positioning sensor and the one or more inductive elements and the controller is further configured to receive data from the environmental sensor and the positioning sensor. In some embodiments, the PCB comprises a plurality of inductive elements, including at least one inductive element implemented on a first side of the PCB and at least one inductive element implemented on a second side of the PCB.

The apparatus may further comprise an encasement implemented all around the PCB and affixed to a portion of the spindle proximate to the central location. In some embodiments, the PCB and the encasement implemented around the PCB are each substantially circular in shape in the one plane of the PCB, and a corresponding plane of the encasement. The PCB and the encasement implemented around the PCB may be configured to rotate around an axis defined by the spindle, such that the region at the edge of the PCB passes through a magnetic field.

The spindle may be affixed to a source of an externally-generated rotational force. In some embodiments, the apparatus further comprises a magnet configured to be affixed to a surface and configured to have at least one portion of the magnet overlap with at least one portion of the region at the edge of the PCB. In some embodiments, the source of the externally-generated rotational force is coupled to the surface to which the magnet is affixed. The source of the externally-generated rotational force may be a rotating axle of a vehicle, and the magnet may be affixed to the vehicle.

In some embodiments, the environmental sensor is implemented on a first location of the PCB, and the positional sensor is implemented on a second location of the PCB, such that the first location is diametrically opposite the second location. The environmental sensor may be a non-directional sensor configured to obtain scalar-based sensor readings.

In some embodiments, the environmental sensor is a directional sensor configured to obtain sensor readings with respect to one or more directions determined relative to a determined position of the positioning sensor. The controller may be further configured to determine respective positions of the positioning sensor in relation to a magnetic field, determine respective directions of the environmental sensor with respect to the respective positions and correlate the sensor readings from the environmental sensor with corresponding directions of the environmental sensor.

The positioning sensor may be implemented in the region at the edge of the PCB and may be configured to transmit a positioning signal to the controller in response to detecting a magnetic field of the magnet. In some embodiments, the PCB further comprises a memory configured to store data from the environmental sensor and the positioning sensor, and coupled to the controller.

In some embodiments, the PCB further comprises a wireless transceiver coupled to the controller and configured to transmit and receive wireless communications. The wireless transceiver may be configured to transmit processed sensor readings received and processed by the controller, on a periodic basis. The wireless transceiver may be configured to transmit processed sensor readings received and processed by the controller, in response to receiving a communication requesting transmission of the processed sensor readings. In some embodiments, the wireless transceiver and the controller are implemented on a single semiconductor die.

In some embodiments, the controller is configured to determine one or more rotational directions of the apparatus. The controller may be further configured to determine a spike in electrical energy of a first inductive element at a first time within a revolution of the apparatus, determine a spike in electrical energy of a second inductive element at a second time within the revolution and determine a first rotational direction of the apparatus based on the determined spikes of electrical energy in the first inductive element and the second inductive element. In some embodiments, the apparatus further comprises one or more power supplies communicatively coupled with the controller, wherein each power supply is implemented on the PCB and is coupled to at least one inductive element.

In accordance with some implementations, the present disclosure relates to a method of forming a sensing apparatus, comprising implementing one or more inductive elements within a region at an edge of a PCB, wherein each inductive element is configured to generate electrical energy by passing through a magnetic field. In some implementations, the method includes implementing at least one environmental sensor on the PCB, implementing a controller on the PCB, configured to be powered by the one or more inductive elements and communicatively coupled to the at least one environmental sensor and implementing a spindle through the center of the PCB, configured to allow rotation of the PCB about an axis defined by the spindle.

The method may further comprise implementing an encasement surrounding the PCB and affixed to at least a portion of the spindle. In some implementations, the method further comprises implementing a source of a magnetic field so as to allow the region at the edge of the PCB to pass through the magnetic field. The method may further comprise implementing one or more power supplies communicatively coupled with the controller, wherein each power supply is implemented on the PCB and is coupled to at least one inductive element.

In accordance with some implementations, the present disclosure relates to a method of operating a sensing apparatus at a controller. In some implementations, the method comprises obtaining one or more sensor readings from an environmental sensor at an instant of time, the environmental sensor configured to take omni-directional readings while implemented on a PCB configured to rotate about an axis within a plane. In some implementations, the method includes determining a relative position of the environmental sensor at the instant of time and correlating the one or more sensor readings with the relative position of the environmental sensor at the instant of time.

The method may further include determining a relative position of a position sensor implemented on the PCB at the instant of time and determining the relative position of the environmental sensor based on the determined relative position of the position sensor. The method may further include transmitting the correlated one or more sensor readings. The method may further include determining a spike in electrical energy of a first inductive element at a first time within a revolution of the apparatus, determining a spike in electrical energy of a second inductive element at a second time within the revolution and determining a first rotational direction of the apparatus based on the determined spikes of electrical energy in the first inductive element and the second inductive element.

In accordance with some implementations, the present disclosure relates to an apparatus comprising means for obtaining one or more sensor readings from an environmental sensor at an instant of time, wherein the environmental sensor is configured to take omni-directional readings while implemented on a PCB configured to rotate about an axis within a plane, means for determining a relative position of the environmental sensor at the instant of time and means for correlating the one or more sensor readings with the relative position of the environmental sensor at the instant of time.

BRIEF DESCRIPTION OF THE DRAWINGS

Various embodiments are depicted in the accompanying drawings for illustrative purposes, and should in no way be interpreted as limiting the scope of this disclosure. In addition, various features of different disclosed embodiments can be combined to form additional embodiments, which are part of this disclosure.

FIG. 3C is a table illustrating example sensor readings correlated with example positional and temporal data, according to one or more embodiments of the present disclosure.

DETAILED DESCRIPTION

While certain embodiments are described, these embodiments are presented by way of example only, and are not intended to limit the scope of protection. Indeed, the novel methods and systems described herein may be embodied in a variety of other forms. Furthermore, various omissions, substitutions and changes in the form of the methods and systems described herein may be made without departing from the scope of protection.

The headings provided herein are for convenience only and do not necessarily affect the scope or meaning of the claims. Disclosed herein are example configurations and embodiments related to a sensing apparatus that may include a scanning platform with one or more sensors and a power generation system.

Overview

Certain embodiments, examples, and/or implementations disclosed herein may allow a sensing apparatus to obtain environmental sensor readings in a full range of directions (e.g., omni-directionally) in a given plane. In some embodiments, the sensing apparatuses described herein may be self-powered through implementation of inductive elements configured to pass through a magnetic field. In some embodiments, the sensing apparatuses described herein may allow for correlation of obtained environmental sensor readings with associated time and position data.

Sensing Apparatus

Figure 1A:
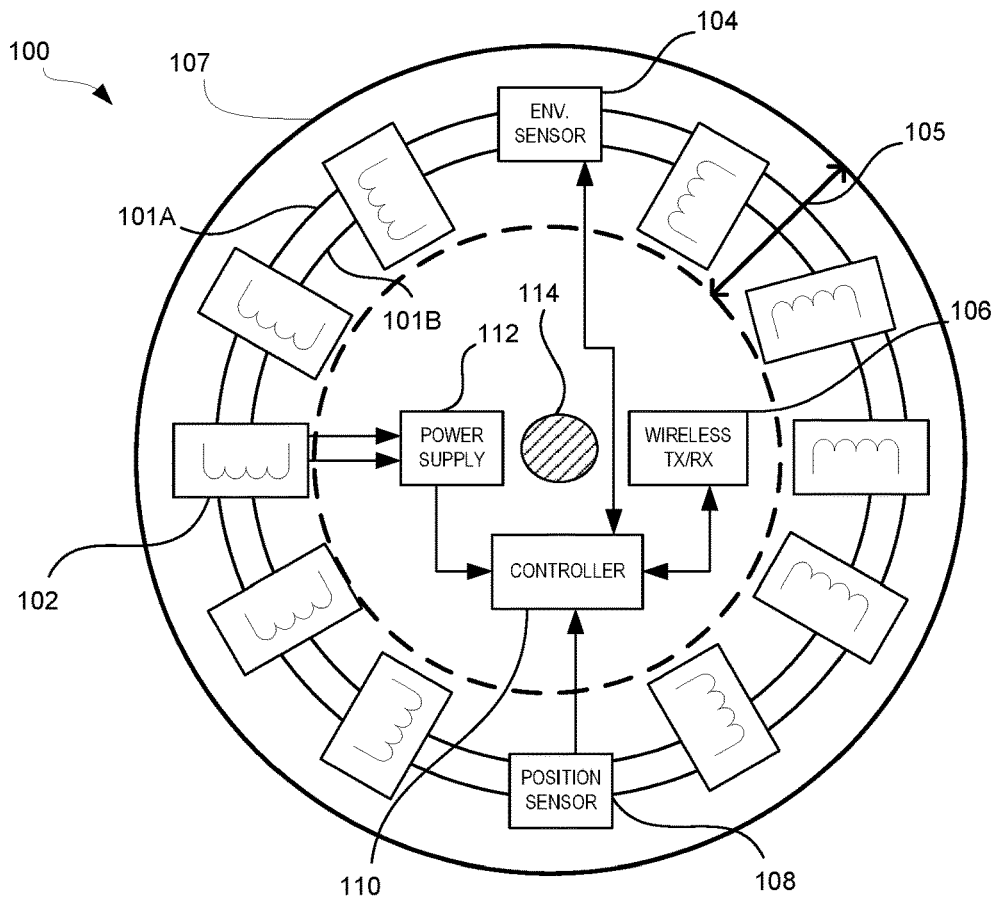
FIG. 1A is a diagram illustrating a schematic representation of a sensing apparatus, according to one or more embodiments of the present disclosure.

FIG. 1A is a diagram illustrating a schematic representation of a sensing apparatus 100, according to one or more embodiments of the present disclosure. In particular, FIG. 1A illustrates an overhead view of the sensing apparatus 100. In some embodiments, the sensing apparatus 100 includes one or more inductive elements 102, such as inductors, implemented on a printed circuit board (PCB) 107. In some embodiments, PCB 107 is symmetrical in shape and is configured to rotate about a central point. In some embodiments, PCB 107 is substantially circular in shape, as illustrated in FIG. 1A. PCB 107 may exhibit one or more characteristics of printed circuit boards known to those having ordinary skill in the art, including double-sided mounting of components and routing of traces. FIG. 1A may be interpreted to provide a top-down view of sensing apparatus 100 and PCB 107. As such, in some embodiments, sensing apparatus 100 includes a spindle 114. Spindle 114 may be implemented substantially in the center of PCB 107. In some embodiments, spindle 114 may be a rigid object such as a rod, and may protrude through PCB 107. Spindle 114 may also be configured to allow rotation of PCB 107 about an axis defined by spindle 114. While spindle 114 is shown to be located at a substantially central location of a circular-shaped PCB 107, spindle 114 may be implemented at a substantially central location of another shaped PCB (e.g., a square or rectangle), or at a non-substantially central location of a PCB.

The one or more inductive elements 102, may be electrically connected to a power supply circuit 112. Power supply circuit 112 may be configured to convert energy received from one or more inductive elements 102 into a source of electrical energy for one or more components of the sensing apparatus 100. In some embodiments, power supply circuit 112 exhibits one or more characteristics of power supplies known to those having ordinary skill in the art, such as overload protection. Power supply circuit 112 may be implemented for example, as a stand-alone device, module, packaged module, die, semiconductor die, integrated circuit or in combination with another circuit block. In some embodiments, power supply circuit 112 is rated to operate under one or more extreme environmental conditions, such as high or low temperatures, high humidity, high UV light exposure and/or high or low air pressure, as some non-limiting examples.

Sensing apparatus 100 may also include a controller 110, coupled to power supply circuit 112. In some embodiments, controller 110 is a microcontroller unit (MCU), implemented on a single integrated circuit, including one or more processors, memory and input/output (I/O) interfacing elements. Controller 110 may be configured to be powered by power supply 112 (e.g., power harnessed with the use of one or more inductive elements 102 passing through magnetic field(s)), and may be configured to communicate with and/or control the operation of one or more sensors implemented on the sensing apparatus 100. Controller 110 may also be configured to communicate with a distinct communication circuit block such as wireless transceiver 106. The wireless transceiver 106 may be communicatively coupled to one or more antenna devices (not shown), which may be configured to wirelessly transmit/receive data and/or power signals to/from another computing device using, but not limited to peer-to-peer, WLAN or cellular communications. For example, the wireless transceiver 106 may be utilized to communicate data and/or power between sensing apparatus 100 and an external host system (not shown). Wireless transceiver 106 may include connectivity circuitry, including components such as a host interface, which may be, for example, an interface for communicating with a host device or system (not shown) over a wired or wireless connection. The host interface may be associated with any suitable or desirable communication protocol and/or physical connector, such as Universal Serial Bus (USB), Micro-USB, WiFi, Bluetooth, FireWire, PCIe, or the like. For wireless connections, the host interface may be incorporated with the wireless transceiver 106 and/or controller 110.

In some embodiments, controller 110 maintains an internal chronometer, timer, or machine clock. Controller 110 may be configured to receive one or more sensor readings and/or measurements from a sensor (e.g., environmental sensor 104) implemented on sensing apparatus 100. Controller 110 may be configured to receive positional information from a position sensor 108, and additionally be configured to correlate one or more sensor readings (e.g., from environmental sensor 104) with the corresponding time or times such readings were obtained and/or with the corresponding relative position of the sensor readings. This correlation process is explained in greater detail throughout this disclosure. Controller 110 may access (e.g., read, write and/or erase) data stored in a memory (not visible in FIG. 1A) and may store such sensor readings, positional data and/or temporal data obtained from one or more sensors and retrieve such data for transmission to an external recipient. This memory may be integrated into controller 110 or located on PCB 107 separately but in communication with controller 110.

The controller 110 may be one or more general-purpose processing devices such as a microprocessor, central processing unit (CPU), a microcontroller (MCU) or the like. For example, the controller 110 may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The controller 110 may also be one or more special-purpose processing devices such as an application specific integrated circuit (ASIC), a field programmable gate array (FPGA), a digital signal processor (DSP), network processor, or the like. The processing device may execute instructions for performing the algorithms, operations, functions, actions, and/or steps discussed herein.

In some embodiments, controller 110 exhibits one or more characteristics of controllers or MCU's known to those having ordinary skill in the art. In some embodiments, controller 110 is a more sophisticated component than an MCU, and may further include additional analog and/or digital and/or RF circuitry. Controller 110 may be rated to operate under one or more extreme environmental conditions. In some embodiments, controller 110 is designed to operate with low power consumption.

In some embodiments, memory (not shown in FIG. 1A) may store data that may be used by the controller 110 to convey and/or transmit information. For example, the memory may store data indicating an identification number (e.g., a serial number) for the sensing apparatus 100. In another example, the memory may store data indicating a purpose (e.g., to measure temperature, to detect sound levels, to detect proximity to other objects, to visually detect the presence of objects within a specific radius, etc.). In one embodiment, the data stored in the memory may be generated by one or more sensor devices of the sensing apparatus 100. For example, the data may indicate temperatures detected by a thermometer (e.g., a temperature sensing environmental sensor 104).

Sensing apparatus 100 may include a wireless transceiver 106, for sending and/or receiving information such as data, commands and/or instructions. For example, wireless transceiver 106 may be configured to transmit sensor readings processed by controller 110 and correlated to relative positions and/or time. In some embodiments, wireless transceiver 106 is configured to transmit unprocessed and/or uncorrelated sensor readings directly from one or more sensors (e.g., environmental sensor 104). For example, a sensing apparatus 100 may not include a controller 110, and therefore a wireless transceiver 106 may directly communicate such sensor readings and/or positional information from a position sensor 108.

Sensing apparatus 100 may also include one or more sensors implemented on PCB 107. A sensor may be a component, module, circuit, etc., that may detect events, conditions, physical properties of an object, changes in conditions, changes in physical properties, etc. The one or more sensor devices may generate data to indicate the events, conditions, physical properties, changes in conditions, and/or changes in physical properties. For example, the one or more sensor devices may detect environmental conditions (e.g., temperature, humidity, etc.). The one or more seniors may generate data indicating the environmental conditions at different periods/points in time. In another example, the one or more sensor devices may be an accelerometer that may detect movement of the sensing apparatus 100 and/or movement of an object where the sensing apparatus 100 is attached (e.g., horizontal and/or vertical motion, vibrations, etc.). The one or more sensor devices may generate data indicating the movement of the object where the sensing apparatus 100 is attached (e.g., data indicating the direction/speed of the motion).

One or more of these sensors may be environmental sensors 104. In some embodiments, an environmental sensor is configured to detect or obtain sensor readings regarding one or more environmental parameters such as proximity to other objects, temperature, humidity, flow rate, air pressure and rate of change of proximity, as non-limiting examples. In some embodiments, a respective environmental sensor is configured to obtain sensor readings for a respective environmental parameter. While FIG. 1A depicts implementation of a single environmental sensor 104, one of ordinary skill in the art will realize that additional environmental sensors may be implemented on a single PCB 107 of a sensing apparatus 100, and/or that environmental sensor 104 may be able to obtain sensor readings for more than one environmental parameter (e.g., temperature and humidity). Sensing apparatus 100 may also implement a positional sensor 108, which will be described in greater detail below.

Figure 1B:
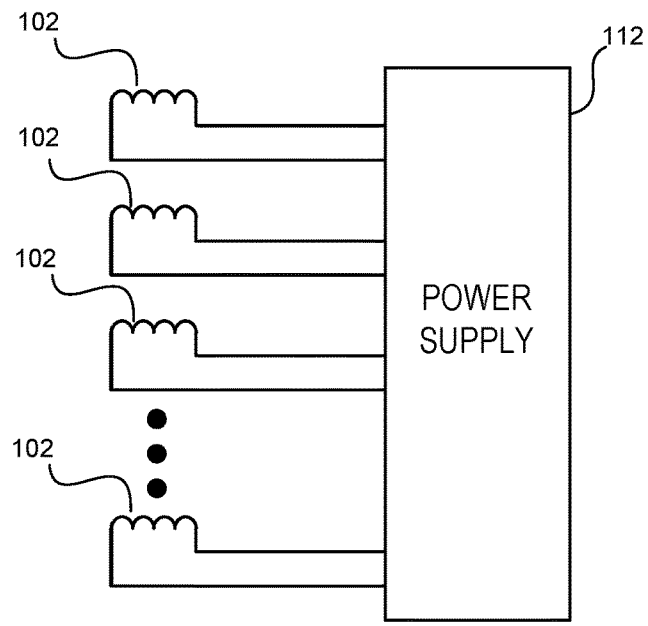
FIG. 1B is a diagram illustrating a schematic representation of a power generation system of the sensing apparatus of FIG. 1A, according to one or more embodiments of the present disclosure.

In some embodiments, one or more inductive elements 102 are implemented within a region 105. The region 105 may extend inward from the outer edge or edges of PCB 107, by a fixed, predetermined radial distance. In some embodiments, region 105 may be considered a band or a ring of PCB 107 defined by a first radius from the center of PCB 107 to a second radius from the center of PCB 107 (e.g., if PCB 107 is substantially circular in shape). The inductive elements 102 are shown in FIG. 1A to be implemented in plurality, and also on at least one track 101 (e.g., outer track 101A and inner track 101B). FIG. 1B is a diagram illustrating a schematic representation of a power generation system of the sensing apparatus of FIG. 1A, according to one or more embodiments of the present disclosure. In some implementations, each of one or more inductive elements 102 are electrically connected to power supply circuit 112 in parallel, as illustrated in FIG. 1B. As such, the one or more tracks 101 shown in FIG. 1A may each provide a routing pathway for traces to run from inductive elements 102 to the power supply circuit 112. In some embodiments, a track 101 runs under or around one or more components implemented on the same side of the PCB 107. In some embodiments, a track 101 runs at least in part on the opposite side of a side on which the other components of sensing apparatus 100 are implemented.

Figure 2A:
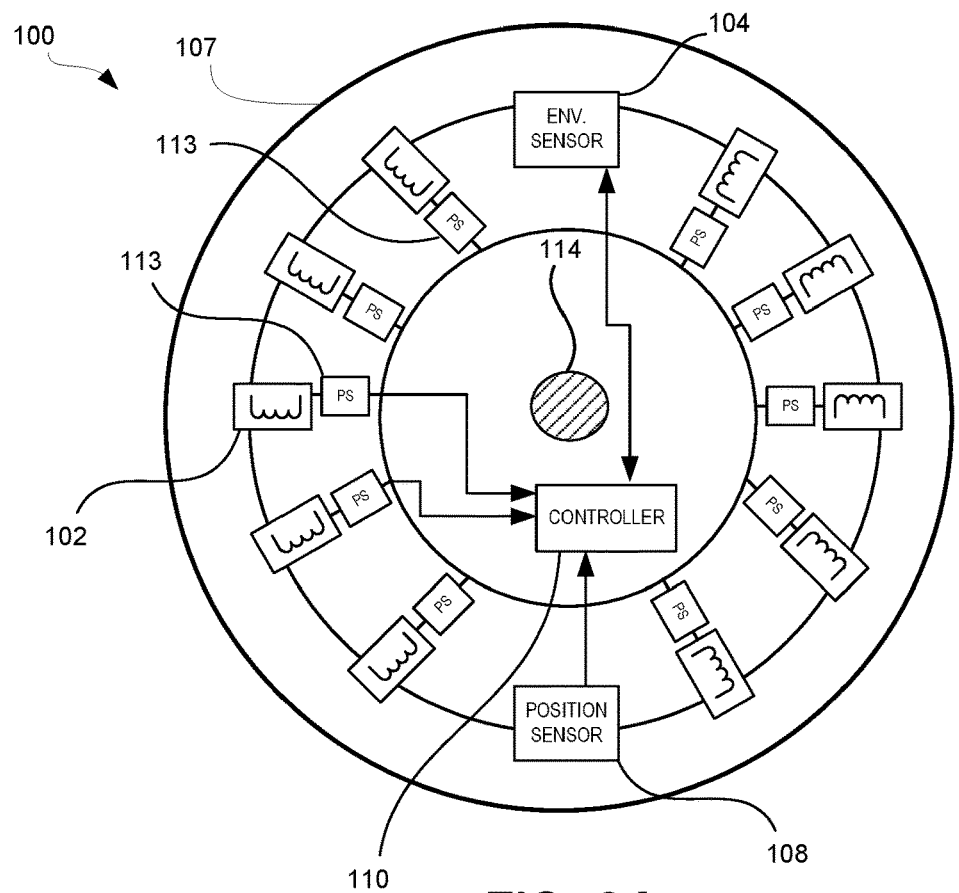
FIG. 2A is a diagram illustrating a schematic representation of a sensing apparatus, according to one or more embodiments of the present disclosure.

FIG. 2A is a diagram illustrating a schematic representation of a sensing apparatus 100, according to one or more embodiments of the present disclosure. For ease of illustration, sensing apparatus 100 of FIG. 2A does not show a wireless transceiver (e.g., wireless transceiver 106 of FIG. 1A), however one of ordinary skill in the art will understand that this component may be implemented in some embodiments, and/or implemented in part with controller 110. In FIG. 2A, an alternative embodiment of a sensing apparatus 100 is shown, with a plurality of power supplies 113 implemented with the one or more inductive elements 102. In some embodiments, there is a one-to-one relationship between power supplies 113 and inductive elements 102 implemented on PCB 107 and in some embodiments, there are more or fewer power supplies 113 than inductive elements 102. In some embodiments, power supplies 113 are implemented within a region extending inward from the outer edge or edges of PCB 107, as described above with respect to inductive elements 102 and FIG. 1A. As described above with respect to FIG. 1A, power supplies 113 may be positioned adjacent to a track allowing for routing of each power supply 113 to controller 110.

Figure 2B:
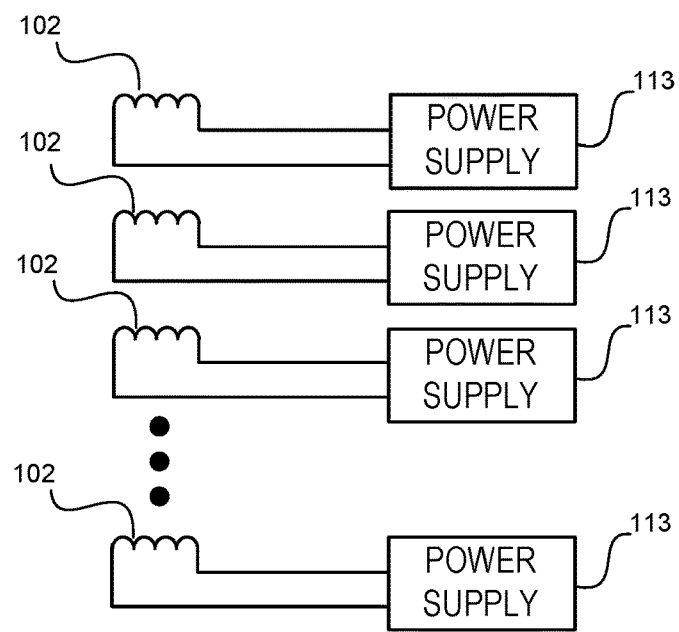
FIG. 2B is a diagram illustrating a schematic representation of a power generation system of the sensing apparatus of FIG. 2A, according to one or more embodiments of the present disclosure.

FIG. 2B is a diagram illustrating a schematic representation of a power generation system of the sensing apparatus 100 of FIG. 2A, according to one or more embodiments of the present disclosure. In some embodiments, as shown in FIG. 2B, a pairing of an inductive element 102 and a power supply 113 may form a branch or arm of a power generation system and possibly in parallel with one or more additional branches. A respective branch of the power generation system shown in FIG. 2B may also have one or more diodes to prevent unintentional discharge of the one or more power supplies 113. In some embodiments, each power supply 113 has one or more characteristics of power supply 112 described above with respect to FIGS. 1A and 1B. In some embodiments, each power supply 113 is communicatively and/or electrically coupled to controller 110.

One having ordinary skill in the art understands that controller 110, one or more environmental sensors 104, inductive elements 102, wireless transceiver 106, one or more position sensors 108, power supply 112, power supplies 113 and/or a source of a magnetic field may be arranged differently in other embodiments. One having ordinary skill in the art also understands that various shapes and/or sizes may be used for PCB 107, controller 110, the one or more environmental sensors 104, inductive elements 102, power supply 112, wireless transceiver 106, the one or more position sensors 108, power supplies 113 and/or a source of a magnetic field. For example, the PCB 107 may be circular, octagonal or rectangular in shape.

Positional Data

Figure 3A:
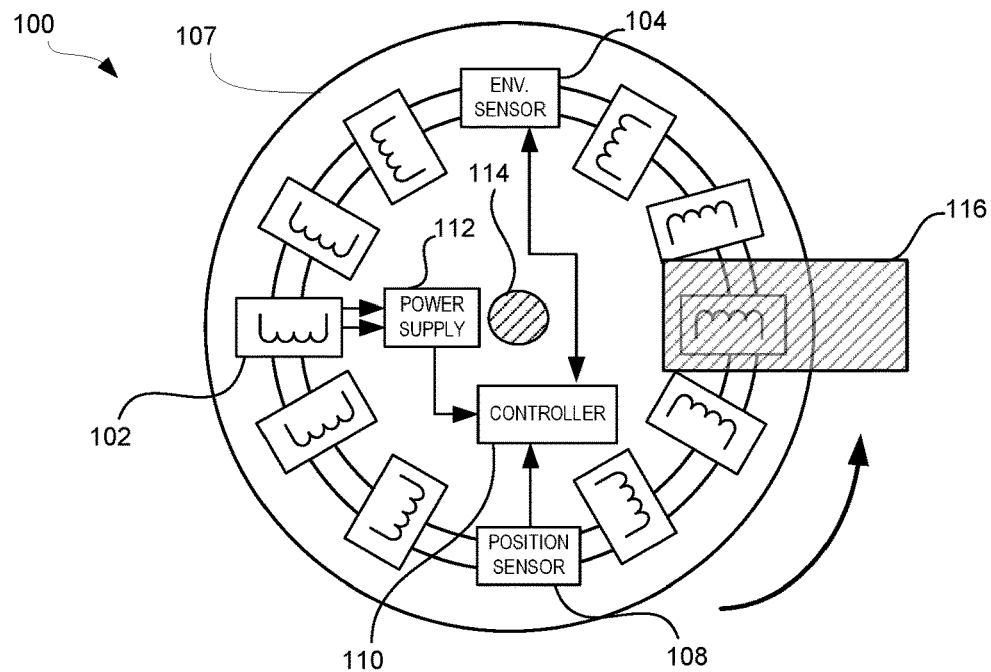
FIG. 3A is a diagram illustrating a first example position of a sensing apparatus, according to one or more embodiments of the present disclosure.
Figure 3B:
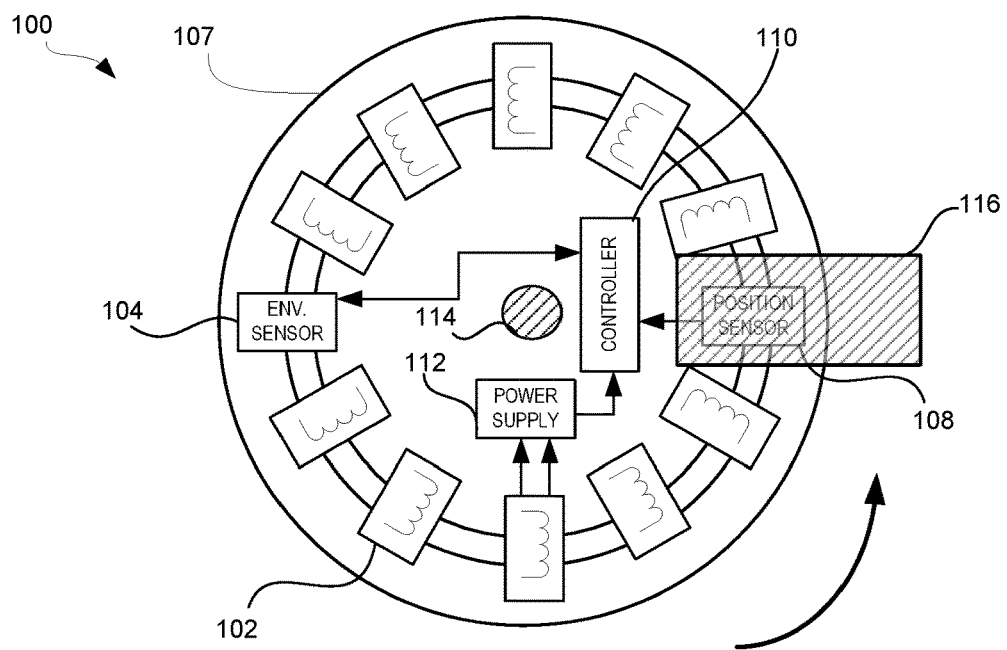
FIG. 3B is a diagram illustrating a second example position of a sensing apparatus, according to one or more embodiments of the present disclosure.

FIG. 3A is a diagram illustrating a first example position of a sensing apparatus 100, according to one or more embodiments of the present disclosure. For ease of illustration, sensing apparatus 100 of FIG. 3A does not show a wireless transceiver (e.g., wireless transceiver 106 of FIG. 1A), however one of ordinary skill in the art will understand that this component may be implemented in some embodiments, and/or implemented in part with controller 110. In some embodiments, sensing apparatus 100 includes a source of a magnetic field, such as magnet 116. FIG. 3B is a diagram illustrating a second example position of a sensing apparatus 100, relative to the fixed position of a source of a magnetic field (e.g., magnet 116).

While FIGS. 3A and 3B illustrate implementation of a single environmental sensor 104, those of ordinary skill in the art will understand that more than one environmental sensor 104 may be implemented anywhere on PCB 107. In some embodiments, each sensor on PCB 107 is powered by controller 110 (e.g., which may be supplied by power supply 112). Sensors may additionally or alternatively be powered by power supply 112.

In some embodiments, sensing apparatus 100, and/or PCB 107, is configured to rotate in one plane, about an axis defined by spindle 114. For example, FIG. 3A and FIG. 3B each illustrate a top-down view of PCB 107, and a counter-clockwise direction of rotation of PCB 107 relative to the fixed position of magnet 116. As illustrated in FIG. 3B, in some embodiments, a position sensor 108, implemented on PCB 107, may be positioned so that it is at least partially located within a magnetic field (e.g., generated by magnet 116) for at least a portion of time during a full rotation/revolution of PCB 107. A position of the position sensor 108 substantially centered within the magnetic field of magnet 116 may be interpreted (e.g., by controller 110) as a starting position, zero position, zero degrees position, and/or an ending position, or 360 degree position with respect to a revolution of PCB 107.

In some embodiments, controller 110, in communication with position sensor 108, is configured to determine the rotational speed of PCB 107. For example, upon entering or upon being centered within the magnetic field of magnet 116, position sensor 108 transmits a communication (e.g., ping, message, status, pulse or signal) to controller 110 to indicate the relative position of position sensor 108 within a revolution of PCB 107. Controller 110 may use the duration of time between communications from position sensor 108, and the radial distance of position sensor 108 from the center of PCB 107 to determine the rotational speed of position sensor 108. In some embodiments, the rotational speed of position sensor 108 may be determined for each revolution, and in some embodiments, the rotational speed of position sensor 108 may be an average value over at least a subset of all revolutions of PCB 107 (e.g., average of the last 5 revolutions).

The rotational speed of position sensor 108 may be used by controller 110 to estimate one or more relative positions of position sensor 108 between communications from position sensor 108. For example, controller 110 determined a rotational speed of 107 ms of position sensor 108 for the most recently completed revolution. In this example, controller 110 estimates that after 9 ms, position sensor 108 has moved 90° from the zero point (e.g., center of the magnetic field of magnet 116). In some embodiments, controller 110 keeps a counter between consecutive communications received from position sensor 108. In some embodiments, position sensor 108 is a Hall sensor or Hall effect sensor, which may implement a transducer that varies its output voltage in response to encountering a magnetic field.

As illustrated in FIGS. 3A and 3B, in some embodiments, position sensor 108 is implemented on a first end of PCB 107 and an environmental sensor 104 is implemented on a second end of PCB 107, which may be diametrically opposite from the first end. For example, if PCB 107 is round or substantially circular as shown in FIGS. 3A and 3B, and a straight line could be drawn from one point on the circumference of PCB 107, through spindle 114 to another point on the circumference of PCB 107, both the position sensor 108 and environmental sensor 104 may be implemented on that straight line.

As a result of this example implementation of each sensor, a relative position of the environmental sensor 104 can be further derived with respect to a relative position of the position sensor 108. For example, as shown in FIG. 3B, position sensor 108 is approximately centered under magnet 116 (or within the magnetic field of magnet 116). In this example, if position sensor 108 is interpreted by controller 110 to be positioned at 0°, and environmental sensor 104 is known to be implemented directly opposite it, controller 110 may interpret the simultaneous relative position of environmental sensor 104 to be at 180° or half a revolution away from the relative position of position sensor 108 at the same time.

Sensor Readings and Correlation

As PCB 107 is rotating about the axis defined by spindle 114, environmental sensor 104 may be obtaining one or more sensor readings. As such, environmental sensor 104 may be configured to take omni-directional readings while implemented on PCB 107. However, in some embodiments, environmental sensor 104 is configured to obtain scalar sensor readings. For example, environmental sensor 104 may obtain temperature readings over a period of time, decibel levels of sound, humidity levels, magnetic field strength, RF signal strength, air pressure levels or any variety of environmental readings. In some embodiments, a sensing apparatus 100 may not have a position sensor 108 implemented on the PCB 107, and as such, may not require direction-based sensor readings from one or more environmental sensors 104.

Some environmental sensors 104 may be implemented on PCB 107 to obtain respective sensor readings intended to be correlated to respective directions around the sensing apparatus 100. As explained above, controller 110 may be configured to determine relative positions of an environmental sensor 104 using a position sensor 108 and one or more sources of magnetic fields (e.g., magnet 116). Controller 110 may be further configured to obtain respective sensor readings from an environmental sensor 104, and correlate each respective sensor reading to a relative position of the position sensor 108, the environmental sensor 104 and/or a relative direction of input of the sensor reading (e.g., based on cardinal directions) and/or a relative time (e.g., Unix time, Coordinated Universal Time).

In some embodiments, the one or more environmental sensors 104 may include passive sensing devices (e.g., a photo diode) with active devices (e.g., radio-frequency transmitters). For example, an environmental sensor 104 may be configured to determine proximity from the sensing apparatus 100 (or an object to which sensing apparatus is affixed), to objects surrounding the sensing apparatus 100. In this example, sensor 104 may emit a signal, electro-magnetic (EM) communication, tone, pulse or sound, as non-limiting examples, and detect (e.g., receive and/or measure) reflections of such transmissions. Other non-limiting examples of environmental sensors 104 include photo diodes, single-pixel cameras, radar detectors, microphones, pH sensors, viscosity sensors, flow speed sensors and blood glucose monitors.

FIG. 3C is a table 300 illustrating example sensor readings correlated with example positional and temporal data of a respective sensing apparatus. As can be seen in the example of table 300, sensor readings of proximity to surrounding objects have been obtained from an environmental sensor (e.g., sensor 104 of FIGS. 3A and 3B) of the sensing apparatus. These obtained sensor readings have been matched up or correlated with corresponding determined positions of a position sensor (e.g., sensor 108 of FIGS. 3A and 3B) of the sensing apparatus. In some embodiments, a controller (e.g., controller 110 of FIGS. 3A and 3B) correlates each of the obtained sensor readings with a respective position of a position sensor and a corresponding respective position of an environmental sensor, determined by the controller to match on the basis of time of occurrence. For example, as explained above, each relative position of the positional sensor may have an actual and/or estimated time associated with it. Additionally, in some embodiments, the time of receipt of a respective sensor reading by the controller may determine an associated time of the respective sensor reading. In some embodiments, an environmental sensor may be configured to provide a time (e.g., time of receipt) associated with each respective sensor reading, and provide the sensor reading along with the associated time to the controller.

Table 300 of FIG. 3C further illustrates that in some embodiments a controller of a sensing apparatus may be able to convert a relative position of a positional sensor and/or relative position of an environmental sensor to an external frame of reference, such as to a set of cardinal directions, GPS coordinates or another frame of reference not relative to the sensing apparatus and/or the source of the magnetic field. Additionally, table 300 illustrates an example set of time stamps which may be the basis for correlating sensor readings with positional/directional data.

Direction

In some embodiments, PCB 107 and/or spindle 114 are configured only to rotate in one direction, within one plane (e.g., only clockwise or only counter-clockwise from a top-down view). In some embodiments, PCB 107 and/or spindle 114 are configured to rotate in two directions within one plane (e.g., clockwise and counter-clockwise from a top-down view). For implementations of sensing apparatus 100 allowing for rotation of PCB 107 in both directions, position sensor 108 may include a sensor to determine relative direction of movement (e.g., with respect to a magnetic field). Additionally, an accelerometer may be implemented on PCB 107, and communicatively coupled to controller 110 to provide information regarding speed, acceleration, direction and movement of PCB 107. In some implementations a second magnetic field (e.g., generated by a second magnet) placed less than 180° from the first magnetic field would indicate if the position sensor 108 passed under the second magnet earlier or later within a respective revolution of PCB 107, allowing for determination of direction of rotation of PCB 107 and/or spindle 114.

This ability to determine the direction of rotation of PCB 107 would provide controller 110 with information to determine accurate relative positions of environmental sensor 104 within a respective revolution of PCB 107. In some embodiments, a change in direction of PCB 107 may be detected after one or more revolutions of PCB 107 in a first direction (e.g., clockwise), to a second direction (e.g., counter-clockwise). A detected change in direction may result in re-calibration by controller 110 to determine a new average rotational speed of PCB 107 (e.g., as described above), and/or a new rotational speed of PCB 107 for a revolution before sensor readings are obtained and/or recorded. In some embodiments, a sensor may be implemented on PCB 107 to detect vibration and/or movement of the sensing apparatus 100 (e.g., due to vibration of an object to which sensing apparatus is affixed). This vibration and/or movement information may allow for controller 110 to compensate for noise, jitter or other distorting factors when interpreting sensor readings from one or more environmental sensors 104.

Figure 3D:
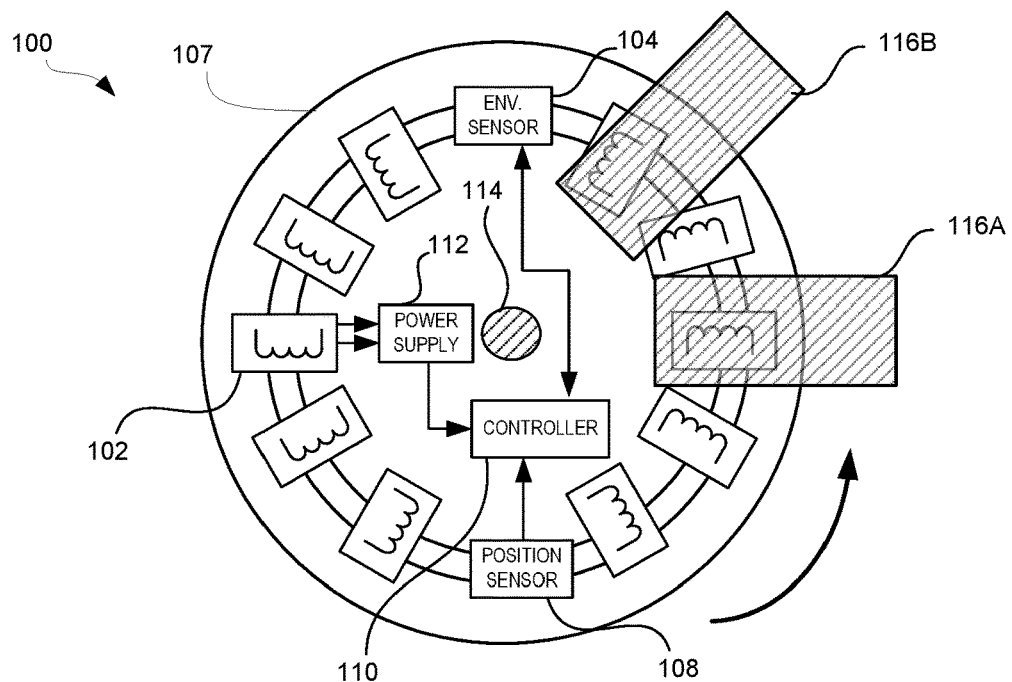
FIG. 3D is a diagram illustrating a first configuration of the sensing apparatus to allow for detecting direction of movement, according to one or more embodiments of the present disclosure.

FIG. 3D is a diagram illustrating a first configuration of the sensing apparatus 100 to allow for detecting direction of movement, according to one or more embodiments of the present disclosure. In FIG. 3D, controller 110 may be configured to determine a direction of movement (e.g., clockwise, counter-clockwise) of the sensing apparatus 100, due to the implementation of two or more sources of magnetic fields (e.g., magnets 116A and 116B). For example, as shown in FIG. 3D, if sensing apparatus 100 is rotating counter-clockwise with respect to a top-down view of PCB 107 (e.g., the top side being populated with one or more components), position sensor 108 will pass through the magnetic field of magnet 116A at a first time, and after a short period of time, will pass through the magnetic field of magnet 116B at a second time. In this same example, if sensing apparatus was rotating in the opposite direction (e.g., clockwise), position sensor 108 would pass through the magnetic field of magnet 116A at a first time, then after a longer period of time (e.g., relative to the prior example), position sensor 108 would pass through the magnetic field of magnet 116B.

In some embodiments, the basis for determining the direction of movement is the relative succession of the magnetic fields that the position sensor 108 encounters. For example, if position sensor 108 is determined (e.g., by controller 110) to have passed through the magnetic field of magnet 116A first, and then through the magnetic field of magnet 116B second, within a complete revolution of sensing apparatus 100, it may be determined that sensing apparatus is rotating in a first direction (e.g., counter-clockwise). Conversely, in same this example, if position sensor 108 is determined (e.g., by controller 110) to have passed through the magnetic field of magnet 116B first, and then through the magnetic field of magnet 116A second, within a complete revolution of sensing apparatus 100, it may be determined that sensing apparatus is rotating in a second direction (e.g., clockwise).

Figure 3E:
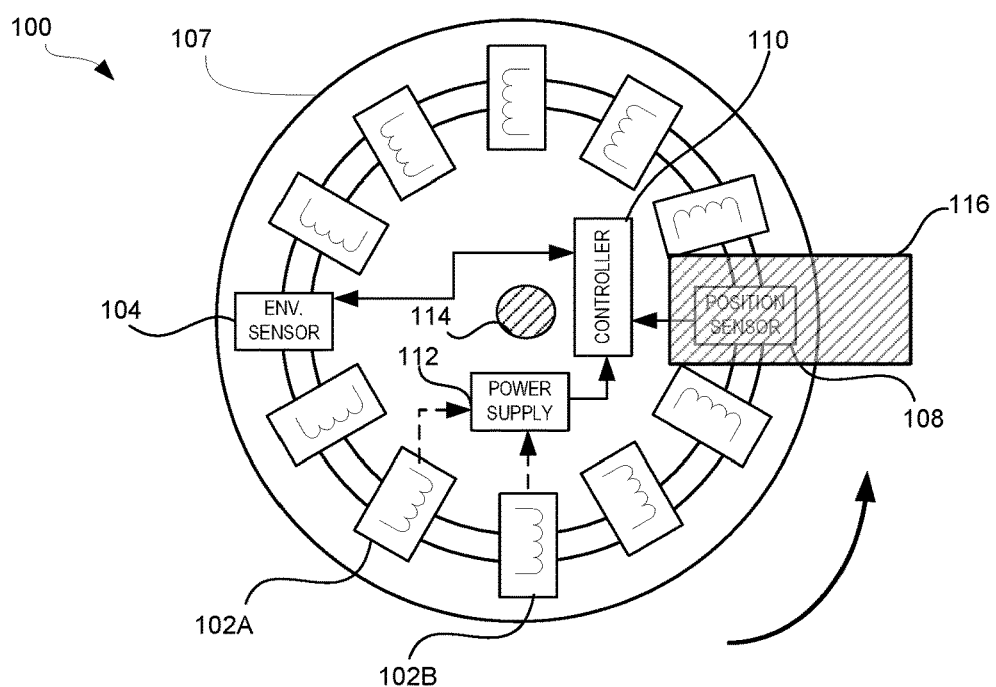
FIG. 3E is a diagram illustrating a second configuration of the sensing apparatus to allow for detecting direction of movement, according to one or more embodiments of the present disclosure.

FIG. 3E is a diagram illustrating another configuration of the sensing apparatus 100 to allow for detecting direction of movement, according to one or more embodiments of the present disclosure. In FIG. 3E, sensing apparatus 100 may be configured to identify two or more inductive elements 102 (e.g., inductor 102A and inductor 102B). In some embodiments, identification of two or more inductive elements 102 is performed by the controller 110 and/or the power supply unit 112. For example, power supply unit 112 may be configured to determine when a spike in electrical energy (e.g., current, voltage and/or power) is experienced at inductor 102A and when a spike in electrical energy is experienced at inductor 102B, and communicate those determinations to controller 110. As such, if it is detected that a relative spike in electrical energy is observed in inductor 102B at a first time, and that a relative spike in electrical energy is observed in inductor 102A at a second time within a complete revolution of sensing apparatus 100, it may be determined that sensing apparatus 100 is rotating in a first direction (e.g., counter-clockwise). Similarly, if it is detected that a relative spike in electrical energy is observed in inductor 102A at a first time, and that a relative spike in electrical energy is observed in inductor 102B at a second time within a complete revolution of sensing apparatus 100, it may be determined that sensing apparatus 100 is rotating in a second direction (e.g., clockwise).

Encasement

Figure 4A:
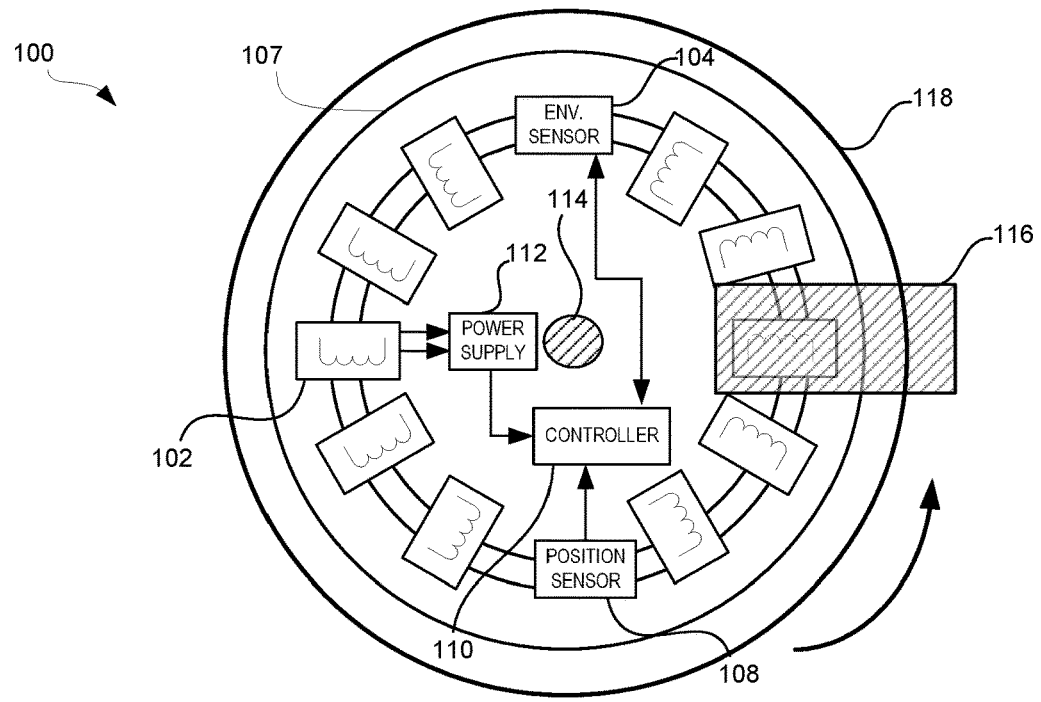
FIG. 4A is a diagram illustrating a top-down view of an implementation of a sensing apparatus with an encasement, according to one or more embodiments of the present disclosure.

FIG. 4A is a diagram illustrating a top-down view of an implementation of a sensing apparatus 100 with an encasement 118, according to one or more embodiments of the present disclosure. As shown in FIG. 4A, PCB 107 and all the components implemented thereupon, may be encased in an encasement 118 composed of a protective material. Encasement 118 may be configured to provide protection from one or more environmental conditions such as extreme temperatures, dirt, humidity, ultraviolet (UV) light, infrared (IF) light, visible light, vibration, extreme pressure and/or moisture, as non-limiting examples. In some embodiments, encasement 118 may be configured to meet requirements for medical grade implementations. For example, encasement 118 may be designed for safe implantation in a human body, may be BPA-free, chemically inert or non-reactive and/or sterile.

In some embodiments, the encasement 118 is configured to block one or more environmental conditions while simultaneously allowing for sensing or observation of another. For example, encasement 118 may be configured to protect PCB 107 and the components implemented thereupon, from dust and dirt while allowing radio-frequency communications to pass through. In some embodiments a small opening may be provided in encasement 118 to allow for an environmental sensor 104 to obtain sensor readings (e.g., for auditory sensory readings). Encasement 118 may also be configured to allow sensing of the magnetic field of a source (e.g., magnet 116) by one or more components of the sensing apparatus 100 (e.g., inductive elements 102 and position sensor 108). Encasement 118 may be substantially composed of glass, plastic, molding compound or another adequately protective material. Some encasement materials may be chosen for a specific application of sensing apparatus. For example, a shatter-proof material may be chosen for the primary composition of encasement 118 for placement of sensing apparatus 100 in an environment with a large risk of impact or shock.

Figure 4B:
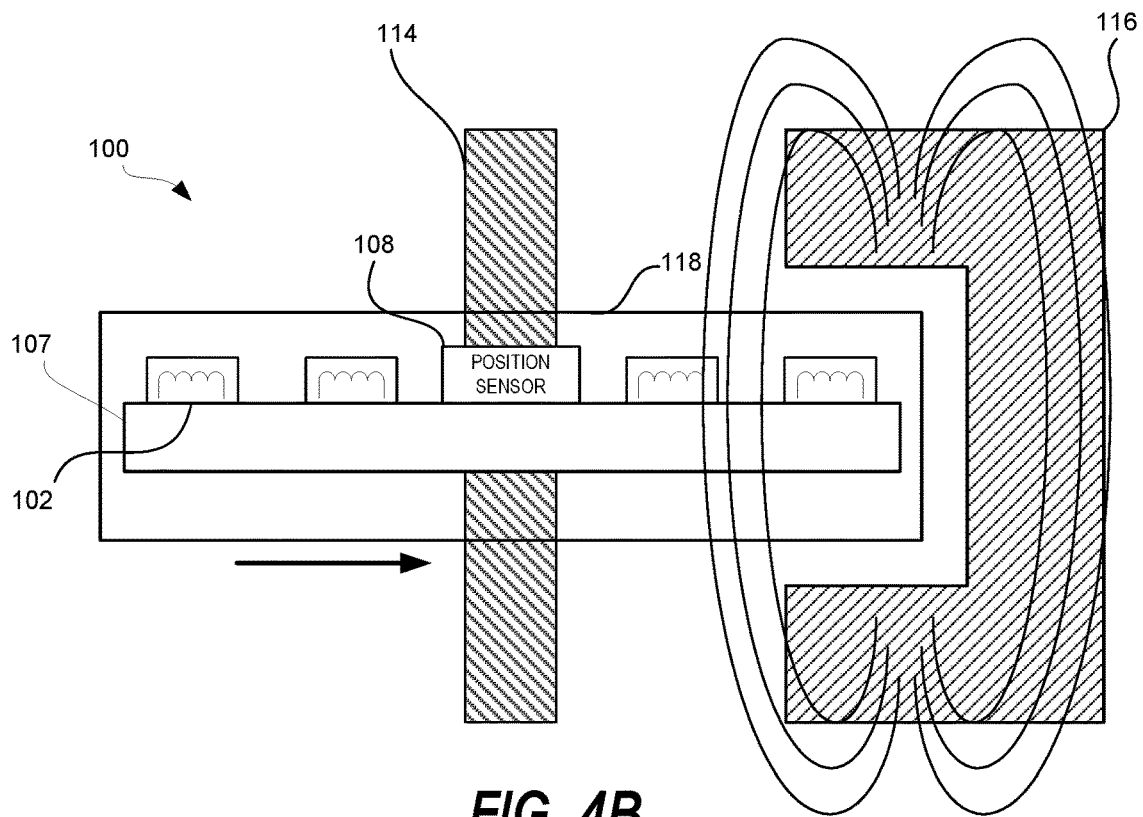
FIG. 4B is a diagram illustrating a side profile of an implementation of a sensing apparatus with an encasement, according to one or more embodiments of the present disclosure.

FIG. 4B is a diagram illustrating a side profile of an implementation of a sensing apparatus with an encasement, according to one or more embodiments of the present disclosure. In some embodiments, encasement 118 is additionally affixed to spindle 114, so that rotation of spindle 114 correspondingly rotates PCB 107 and encasement 118. The side profile of sensing apparatus 100 illustrates a motion of rotation of PCB 107, encasement 118 and spindle 114 in a plane, with respect to a fixed magnet 116. In some embodiments a source of a magnetic field such as magnet 116 may partially surround an outer edge of PCB 107 and encasement 118, as shown in FIG. 4B. In some embodiments however, a source of a magnetic field may only provide a magnetic field with respect to one side of PCB 107 (e.g., over the side with inductive elements 102).

Self-Powering Mechanism

FIG. 4B illustrates that one aspect of the present disclosure is the self-powering aspect of sensing apparatus 100. As can be seen in FIG. 4B, as PCB 107 and encasement 118 rotate to the right (e.g., counter-clockwise from a top-down perspective), the one or more inductive elements 102 enter a magnetic field of magnet 116. This movement of a respective inductive element 102 into a magnetic field results in generation of electrical energy within the respective inductive element 102, which is transferred to a power supply (e.g., power supply 112 shown in FIG. 4A and described above).

Rotation of spindle 114 may be provided by a source external to sensing apparatus 100. For example, spindle 114 may be attached to a wind-powered source of power which supplies energy to rotate spindle 114, which in turn generates electrical energy through the movement of one or more inductive elements 102 into magnetic fields, and provides power to one or more sensors and possibly to a wireless transceiver and/or a controller. An external source of rotational power may provide variable amounts of energy (e.g., a wind or water turbine), or a relatively constant amount of energy while in operation (e.g., a fuel-powered engine). Sensing apparatus 100 therefore allows for versatile applications in a variety of environmental conditions, a variety of locations, and a variety of sizes, including in applications where a separate power source cannot be easily provided. Sensing apparatus 100 may even have viable applications in aquatic and vacuum conditions.

In some embodiments, magnet 116 (or another source of a magnetic field) may be attached to an object or a fixed surface. For example, magnet 116 may be attached to the chassis of an automobile. Additionally, spindle 114 may be directly or indirectly attached to the same object or fixed surface. As in the previous example, if magnet 116 is attached to the chassis of an automobile, spindle 114 may be implemented in such a way to be rotated by power from the engine of the automobile, an axle of the vehicle, or wind power while the vehicle is in motion, as non-limiting examples.

Figure 5A:
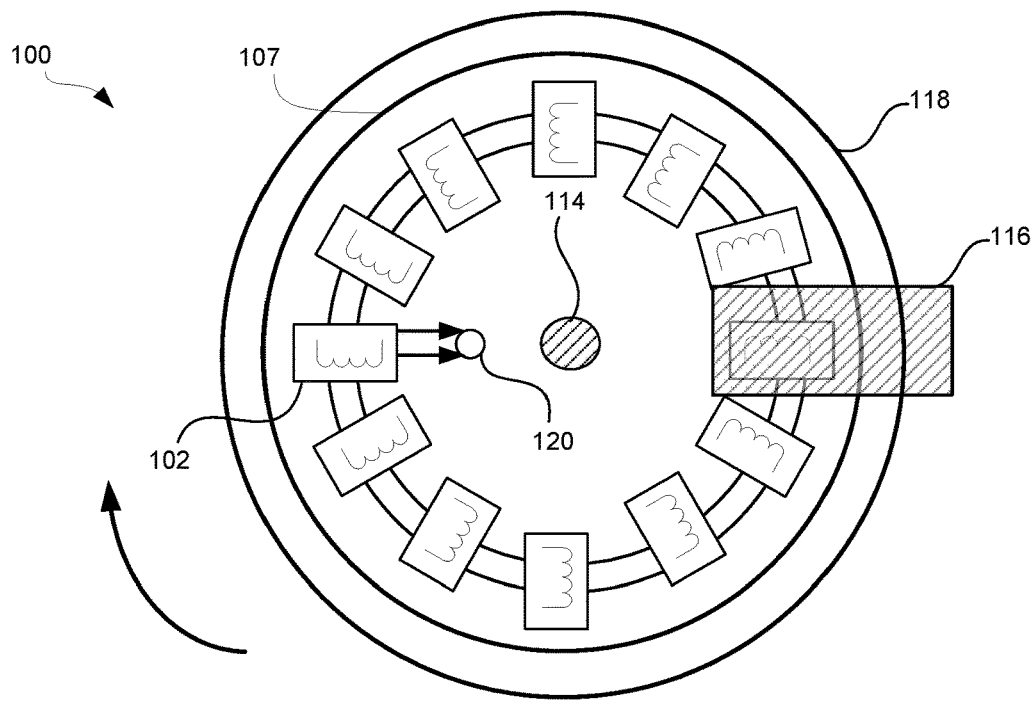
FIG. 5A is a diagram illustrating a bottom-up view of an implementation of a sensing apparatus with additional power generation components, according to one or more embodiments of the present disclosure.
Figure 5B:
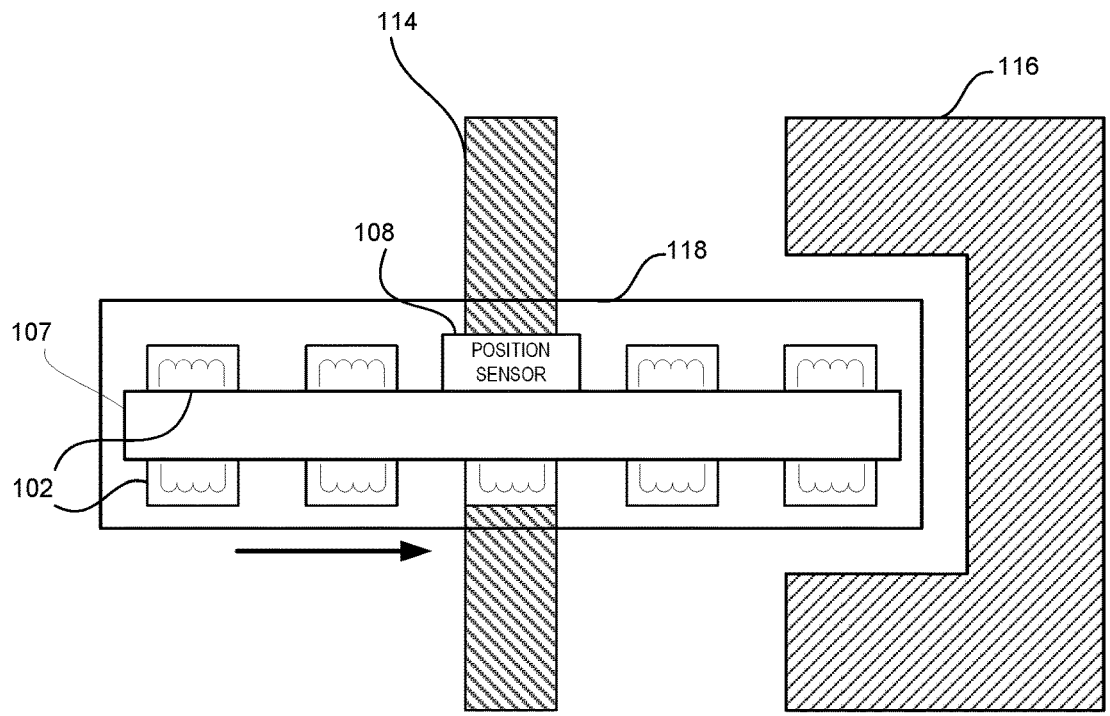
FIG. 5B is a diagram illustrating a side profile of an implementation of a sensing apparatus with additional power generation components, according to one or more embodiments of the present disclosure.

FIG. 5A is a diagram illustrating a bottom-up view of an implementation of a sensing apparatus 100 with additional power generation components, such as inductive elements 102. FIG. 5A illustrates that in some embodiments, inductive elements 102 may be implemented on both sides of a double-sided PCB 107. In such an arrangement, traces for supplying power from the one or more inductive elements 102 through movement into and out of magnetic field(s) may reach a power supply 112 (e.g., as shown in FIG. 4A), through an opening such as a via 120. FIG. 5B is a diagram illustrating a side profile of an implementation of the sensing apparatus 100 with the additional power generation components. In some embodiments, an additional power supply unit may be implemented on the second side of PCB 107 along with the additional power generation components.

Examples of Correlated Sensor Data

Figure 6A:
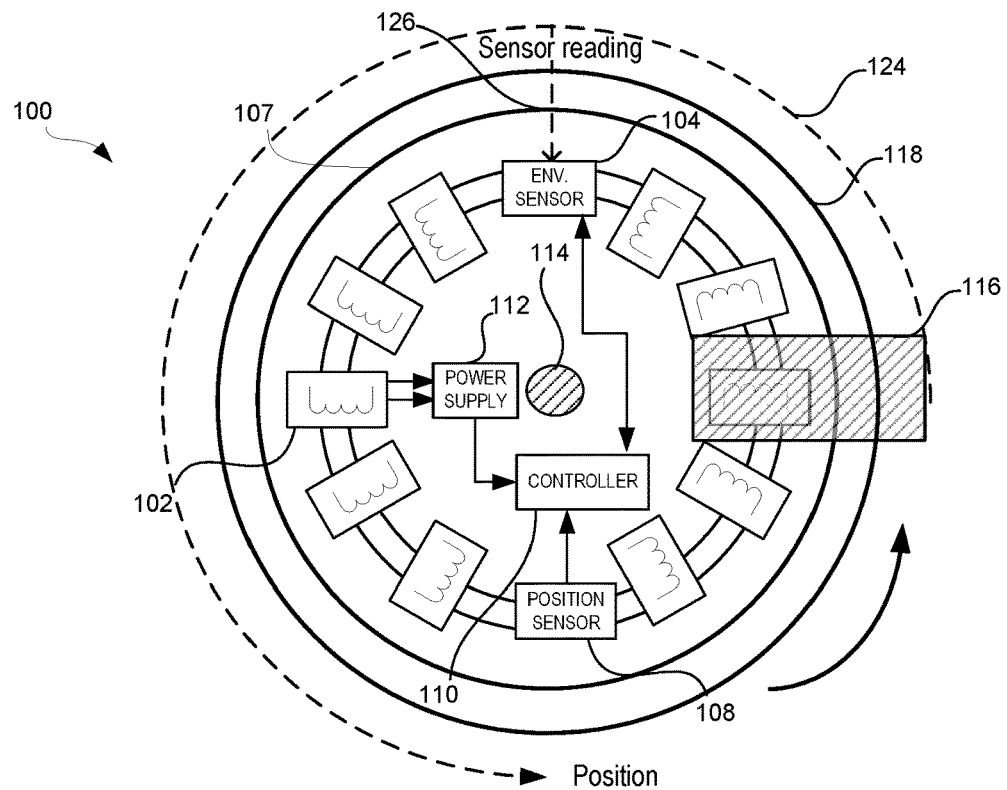
FIG. 6A is a diagram illustrating the relative positional correlation between an environmental sensor and a position sensor, according to one or more embodiments of the present disclosure.
Figure 6B:
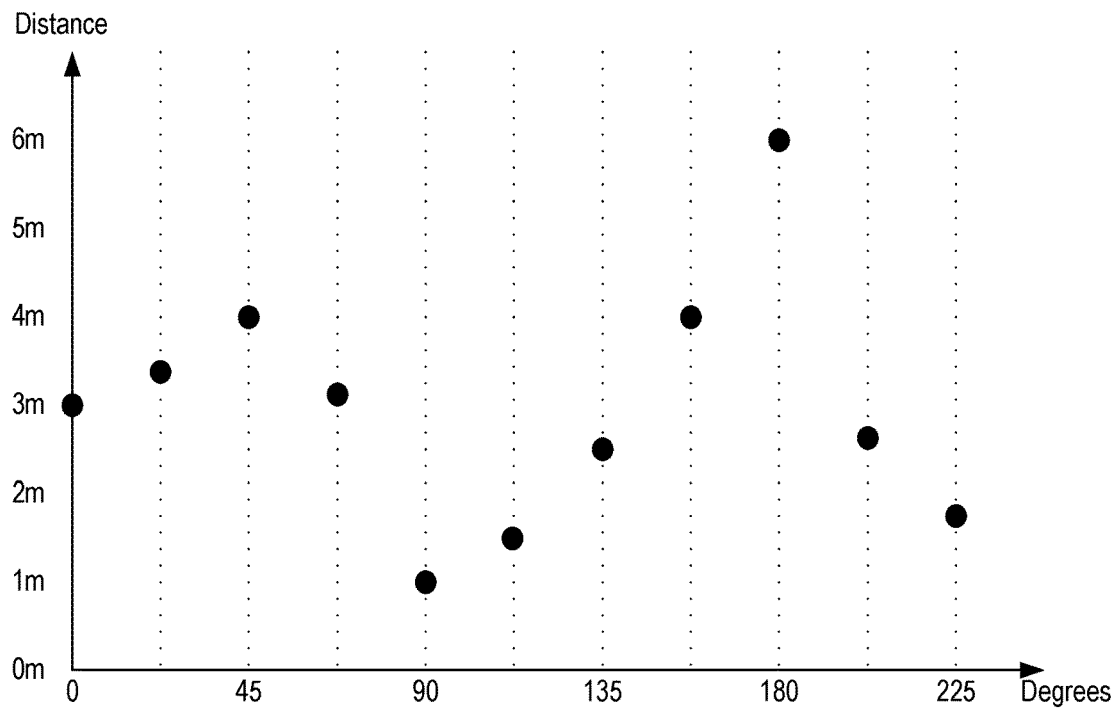
FIG. 6B is a diagram illustrating a graphical representation of correlation between readings from an environmental sensor and measurements from a position sensor, according to one or more embodiments of the present disclosure.

FIG. 6A is a diagram illustrating the relative positional correlation between an environmental sensor 104 and a position sensor 108, according to one or more embodiments of the present disclosure. As described above, a controller 110 may be configured to determine a relative position of position sensor 108, and a corresponding relative position of environmental sensor 104, at the same time as a sensor reading is obtained by the environmental sensor 104. FIG. 6B is a diagram illustrating a graphical representation of correlation between readings from environmental sensor 104 and relative positions of the environmental sensor 104, derived from determined positions of position sensor 108, according to one or more embodiments of the present disclosure.

Figure 7A:
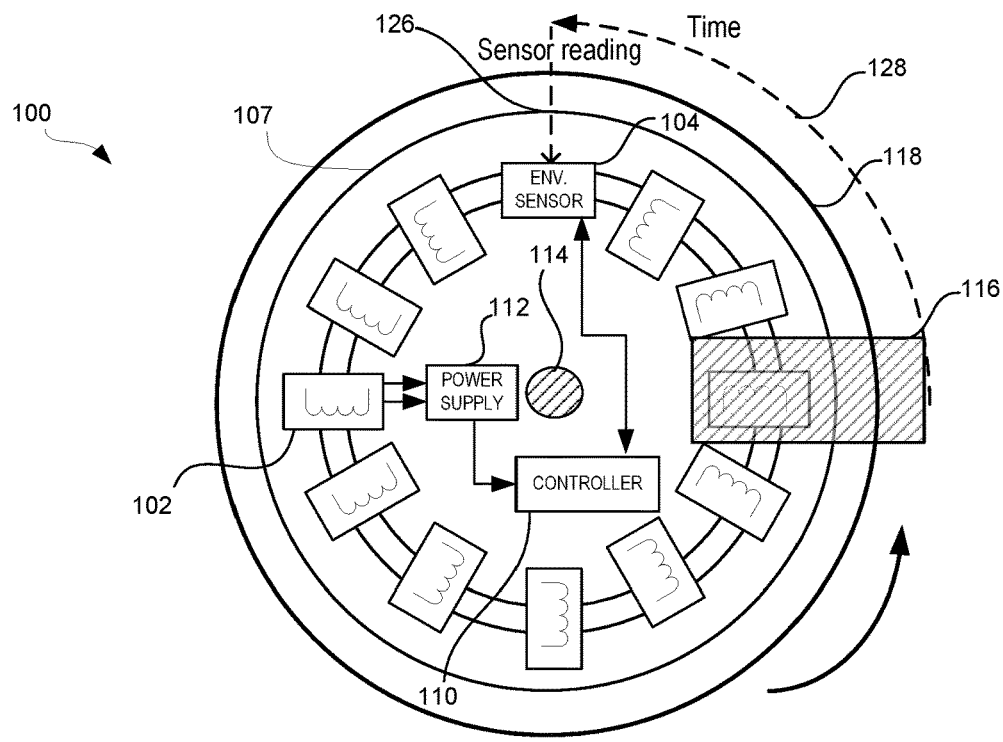
FIG. 7A is a diagram illustrating the relative temporal correlation between an environmental sensor and an internal clock, according to one or more embodiments of the present disclosure.
Figure 7B:
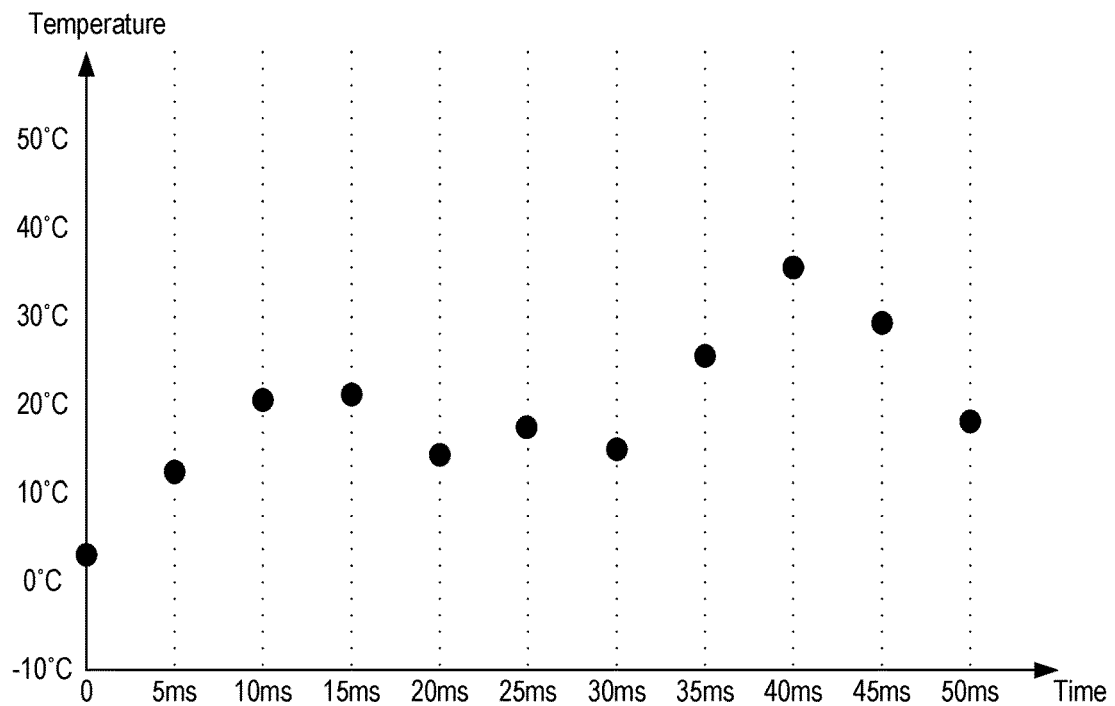
FIG. 7B is a diagram illustrating a graphical representation of correlation between readings from an environmental sensor and temporal measurements, according to one or more embodiments of the present disclosure.

FIG. 7A is a diagram illustrating the relative temporal correlation between an environmental sensor 104 and an internal clock, according to one or more embodiments of the present disclosure. As illustrated in FIG. 7A, in some embodiments, a sensing apparatus 100 may not have a position sensor. In the absence of a position sensor, a sensing apparatus 100 may still provide utility by obtaining scalar sensor readings not correlated to a respective direction or position. For example, environmental sensor 104 may obtain temperature readings over a period of time, decibel levels of sound, humidity levels, magnetic field strength, RF signal strength, air pressure levels or any variety of environmental readings which may not require correlation to a direction of receipt by environmental sensor 104. FIG. 7B is a diagram illustrating a graphical representation of correlation between scalar sensor readings from environmental sensor 104 and corresponding times, according to one or more embodiments of the present disclosure. The corresponding times may be determined by controller 110 as described above.

Processes of Implementation and Operation

Figure 8:
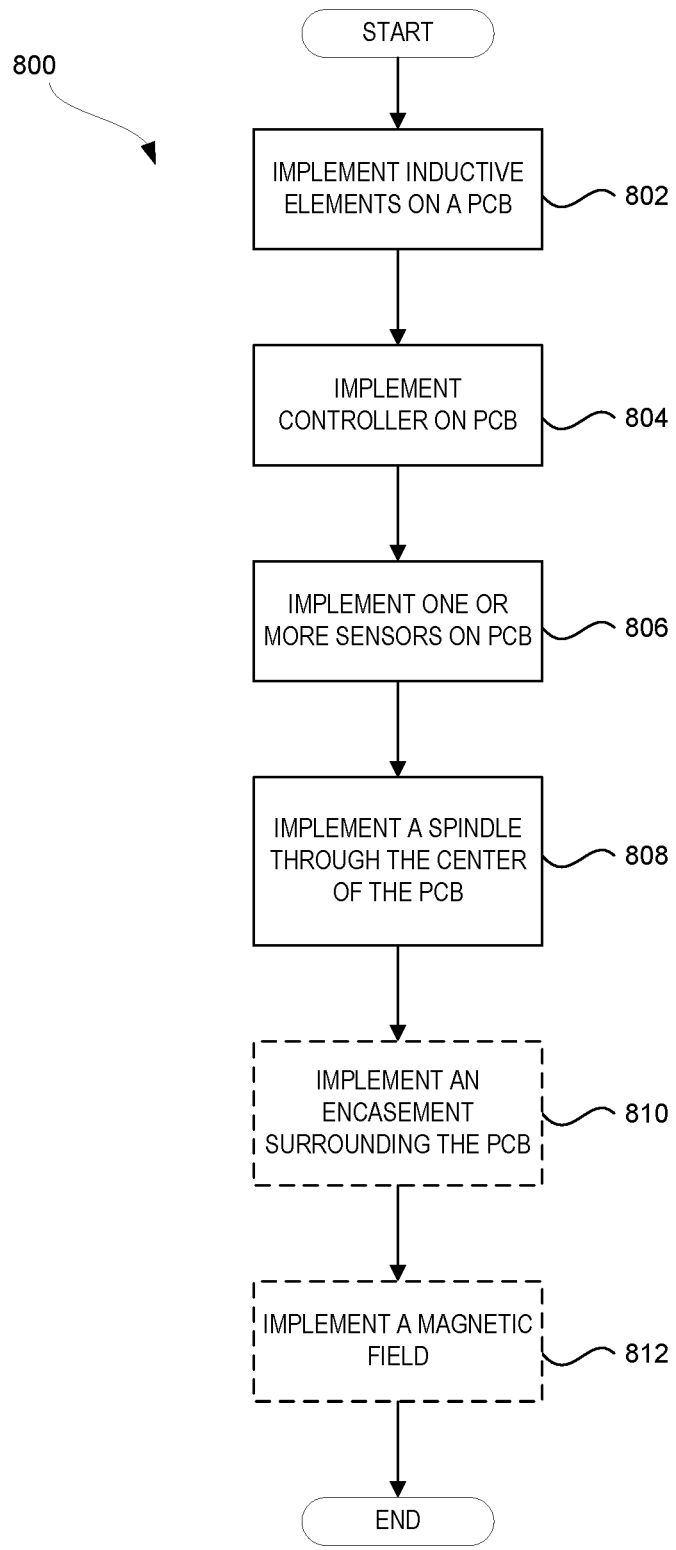
FIG. 8 is a flow diagram illustrating a process for implementing a sensing apparatus, according to one or more embodiments of the present disclosure.

FIG. 8 is a flow diagram illustrating a process 800 for implementing a sensing apparatus, according to one or more embodiments of the present disclosure. The process 800 may be performed by a processing device (e.g., a processor, a controller, a central processing unit (CPU), an ASIC, a FPGA, etc.), and/or parts of a manufacturing assembly (e.g., a soldering device, an encasing machine, a drill etc.). The processing device and/or parts of the manufacturing assembly may comprise processing logic that includes hardware (e.g., circuitry, dedicated logic, programmable logic, microcode, etc.), software (e.g., instructions that run/execute on a processor), firmware, or a combination thereof.

The process 800 begins at block 802 where the process 800 includes implementing one or more inductive elements on a PCB (e.g., inductive elements 102 such as inductors implemented on PCB 107 in FIG. 1A). At block 804 the process may include implementing one or more controllers on the PCB (e.g., controller 110 on PCB 107 in FIG. 1A). In some embodiments, process 800 includes implementing a wireless transceiver on the PCB, such as described with respect to FIG. 1A.

The process 800 may further include implementing one or more sensors on the PCB, as represented by block 806. For example, as described above with respect to FIG. 7A, one or more environmental sensors 104 may be implemented on PCB 107 without implementing any position sensors. And as described in FIG. 6A, the one or more sensors may include one or more environmental sensors 104 and one or more position sensors 108.

As shown by block 808, process 800 may include implementing a spindle through the center of the PCB. For example, spindle 114 of FIG. 4B is shown to protrude through PCB 107. In some embodiments, as represented by block 810, process 800 may include implementing an encasement surrounding the PCB, as described with respect to FIGS. 4A and 4B and throughout the present disclosure. Additionally, in some embodiments, process 800 includes implementing a magnetic field, as represented by block 812.

Figure 9:
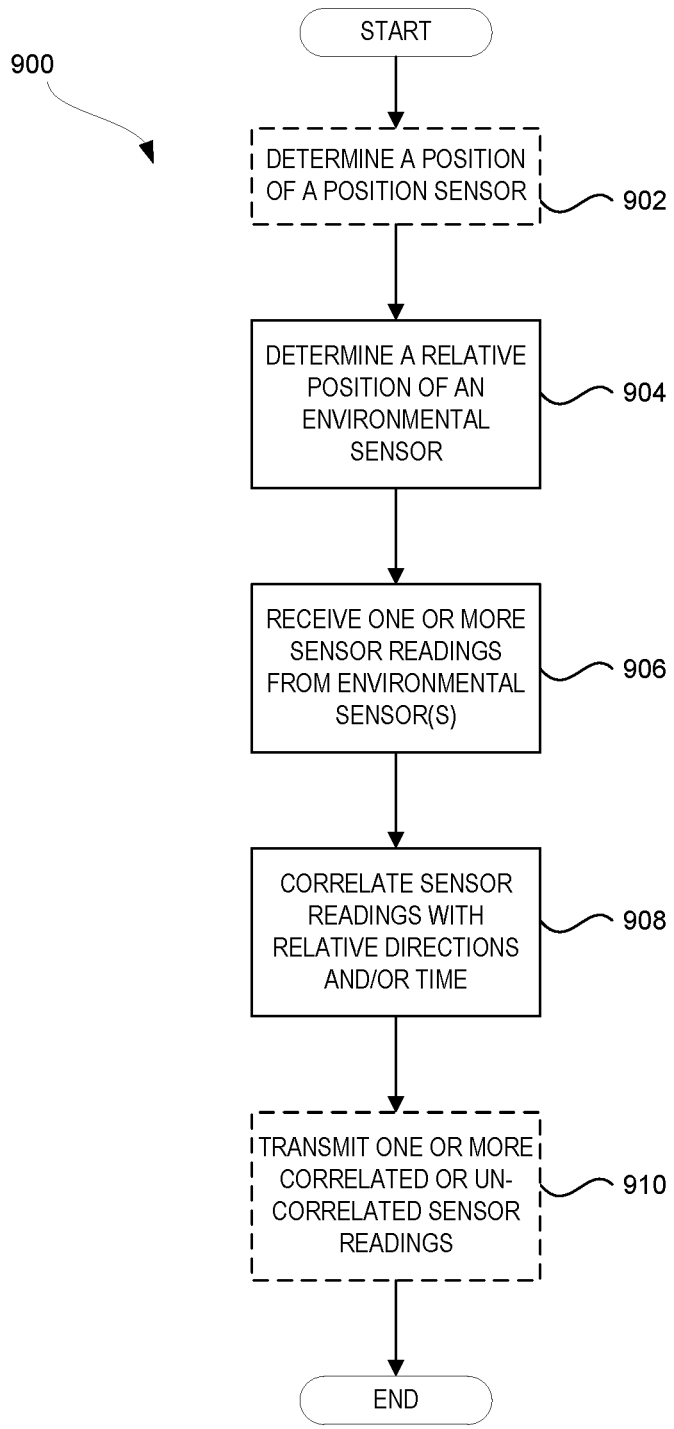
FIG. 9 is a flow diagram illustrating a process for operating a sensing apparatus, according to one or more embodiments of the present disclosure.

FIG. 9 is a flow diagram illustrating a process 900 for operating a sensing apparatus, according to one or more embodiments of the present disclosure. The process 900 may be performed by a processing device (e.g., a processor, a controller, a central processing unit (CPU), an ASIC, a FPGA, etc.), and/or parts of a sensing apparatus (e.g., sensing apparatus 100 illustrated in FIGS. 1A, 2A, 3A, 3B, 4A-6A and 7A). The processing device and/or the parts of the sensing apparatus may include processing logic that includes hardware (e.g., circuitry, dedicated logic, programmable logic, microcode, etc.), software (e.g., instructions that run/execute on a processor), firmware, or a combination thereof.

The process 900 begins at block 902 where in some implementations, process 900 includes determining a position of a position sensor, as described throughout the present disclosure, and in particular with respect to FIGS. 3A-3E and 6A-6B. In some implementations, process 900 includes determining a relative direction and/or position of an environmental sensor, as represented by block 904. For example, FIGS. 3A-3E illustrate how a relative position of the environmental sensor 104 was derived from a relative position of the position sensor 108.

At block 906, process 900 includes receiving one or more sensor readings from one or more environmental sensors. For example, as illustrated in FIG. 7B, a series of sensor readings of temperature were obtained by environmental sensor 104 of FIG. 7A, and then obtained by controller 110 from environmental sensor 104.

In some embodiments, and as represented by block 908, process 900 includes correlating sensor readings with relative directions/positions of one or more sensors, and/or time. For example, FIG. 3C illustrates correlated data from an environmental sensor and a position sensor, on the basis of time. Process 900 may include, as represented by block 910, transmitting one or more correlated or un-correlated sensor readings. For example, correlated sensor readings may be prepared by a controller of the sensing apparatus, which may transmit the sensor readings to a wireless transceiver which then transmits the correlated sensor readings to an external receiving entity (e.g., a smart phone, a computer, a server). In some embodiments, un-correlated sensor readings and/or positioning information of a position sensor may be transmitted to an external receiving entity.

It should be noted that in some embodiments, the sensing apparatus as described herein may be used in conjunction with other technologies and/or techniques for communicating/conveying/providing sensor data to a recipient. For example, the sensing apparatus may be used in conjunction with a variety of power generation techniques to power the rotation of the spindle. In another example, the sensing apparatus may be used in conjunction with a variety of radio-frequency communication technologies, such as, but not limited to Bluetooth, Wi-Fi, cellular data, peer-to-peer and other radio communications. Additionally, the sensing apparatus is not limited to the types of environmental sensors described in the present disclosure. For example, the sensing apparatus may be used with any type of sensing device that can be implemented on the PCB of the sensing apparatus, as described in the present disclosure.

General Comments

Those skilled in the art will appreciate that in some embodiments, other types of computing devices and/or memories may be implemented while remaining within the scope of the present disclosure. In addition, the actual steps taken in the processes discussed herein may differ from those described or shown in the figures. Depending on the embodiment, certain of the steps described above may be removed, others may be added, and/or reordered.

While certain embodiments have been described, these embodiments have been presented by way of example only, and are not intended to limit the scope of protection. Indeed, the novel methods and systems described herein may be embodied in a variety of other forms. Furthermore, various omissions, substitutions and changes in the form of the methods and systems described herein may be made. The accompanying claims and their equivalents are intended to cover such forms or modifications as would fall within the scope and spirit of the protection. For example, the various components illustrated in the figures may be implemented as software and/or firmware on a processor, ASIC/FPGA, or dedicated hardware. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this disclosure, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this disclosure and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such. Furthermore, the terms "first," "second," "third," "fourth," etc., as used herein are meant as labels to distinguish among different elements and may not necessarily have an ordinal meaning according to their numerical designation.

All of the processes described above may be embodied in, and fully automated via, software code modules executed by one or more general purpose or special purpose computers or processors. The code modules may be stored on any type of computer-readable medium or other computer storage device or collection of storage devices. Some or all of the methods may alternatively be embodied in specialized computer hardware.

What is claimed is:

1. An apparatus, comprising:
   a printed circuit board (PCB) comprising a controller, a positioning sensor, an environmental sensor and one or more inductive elements positioned within a region at an edge of the PCB, wherein the one or more inductive elements are configured to generate electrical energy for the controller by passing through a magnetic field; and
   a spindle implemented through the PCB, such that the spindle protrudes through a substantially central location relative to one plane of the PCB;
   wherein the environmental sensor is a directional sensor configured to obtain sensor readings with respect to one or more directions determined relative to a determined position of the positioning sensor; and
   wherein the controller is configured to:
     determine respective positions of the positioning sensor in relation to a magnetic field;
     determine respective directions of the environmental sensor with respect to the respective positions; and
     correlate the sensor readings from the environmental sensor with corresponding directions of the environmental sensor.

2. The apparatus of claim 1, wherein the controller is coupled to the environmental sensor, the positioning sensor and the one or more inductive elements and the controller is further configured to receive data from the environmental sensor and the positioning sensor.

3. The apparatus of claim 1, wherein the PCB comprises a plurality of inductive elements, including at least one inductive element implemented on a first side of the PCB and at least one inductive element implemented on a second side of the PCB.

4. The apparatus of claim 1, further comprising an encasement implemented all around the PCB and affixed to a portion of the spindle proximate to the central location.

5. The apparatus of claim 4, wherein the PCB and the encasement implemented around the PCB are each substantially circular in shape in the one plane of the PCB, and a corresponding plane of the encasement.

6. The apparatus of claim 5, wherein the PCB and the encasement implemented around the PCB are configured to rotate around an axis defined by the spindle, such that the region at the edge of the PCB passes through a magnetic field.

7. The apparatus of claim 6, wherein the spindle is affixed to a source of an externally-generated rotational force.

8. The apparatus of claim 7 further comprising a magnet configured to be affixed to a surface and configured to have at least one portion of the magnet overlap with at least one portion of the region at the edge of the PCB.

9. The apparatus of claim 8, wherein the source of the externally-generated rotational force is coupled to the surface to which the magnet is affixed.

10. The apparatus of claim 9, wherein the source of the externally-generated rotational force is a rotating axle of a vehicle, and the magnet is affixed to the vehicle.

11. The apparatus of claim 5, wherein the environmental sensor is implemented on a first location of the PCB, and the positional sensor is implemented on a second location of the PCB, such that the first location is diametrically opposite the second location.

12. The apparatus of claim 5, wherein the controller is configured to determine one or more rotational directions of the apparatus.

13. The apparatus of claim 1, wherein the environmental sensor is a non-directional sensor configured to obtain scalar-based sensor readings.

14. The apparatus of claim 1, wherein the positioning sensor is implemented in the region at the edge of the PCB and is configured to transmit a positioning signal to the controller in response to detecting a magnetic field of the magnet.

15. The apparatus of claim 1, wherein the PCB further comprises a memory configured to store data from the environmental sensor and the positioning sensor, and coupled to the controller.

16. The apparatus of claim 1, wherein the PCB further comprises a wireless transceiver coupled to the controller and configured to transmit and receive wireless communications.

17. The apparatus of claim 16, wherein the wireless transceiver is configured to transmit processed sensor readings received and processed by the controller, on a periodic basis.

18. The apparatus of claim 17, wherein the wireless transceiver is configured to transmit processed sensor readings received and processed by the controller, in response to receiving a communication requesting transmission of the processed sensor readings.

19. The apparatus of claim 16, wherein the wireless transceiver and the controller are implemented on a single semiconductor die.

20. The apparatus of claim 1, further comprising one or more power supplies communicatively coupled with the controller, wherein each power supply is implemented on the PCB and is coupled to at least one inductive element.

21. An apparatus, comprising:
a printed circuit board (PCB) comprising a controller, a positioning sensor, an environmental sensor and one or more inductive elements positioned within a region at an edge of the PCB, wherein the one or more inductive elements are configured to generate electrical energy for the controller by passing through a magnetic field;
a spindle implemented through the PCB, such that the spindle protrudes through a substantially central location relative to one plane of the PCB; and
an encasement implemented all around the PCB and affixed to a portion of the spindle proximate to the central location, wherein the PCB and the encasement implemented around the PCB are each substantially circular in shape in the one plane of the PCB, and a corresponding plane of the encasement;
wherein the controller is configured to:
determine one or more rotational directions of the apparatus;
determine a spike in electrical energy of a first inductive element at a first time within a revolution of the apparatus;
determine a spike in electrical energy of a second inductive element at a second time within the revolution; and
determine a first rotational direction of the apparatus based on the determined spikes of electrical energy in the first inductive element and the second inductive element.

22. A method of forming a sensing apparatus, comprising:
implementing one or more inductive elements within a region at an edge of a PCB, wherein each inductive element is configured to generate electrical energy by passing through a magnetic field;
implementing at least one environmental sensor on the PCB, the environmental sensor being a directional sensor configured to obtain sensor readings with respect to one or more directions determined relative to a determined position of a positioning sensor;
implementing a controller on the PCB, configured to be powered by the one or more inductive elements and communicatively coupled to the at least one environmental sensor, the controller further configured to:
determine respective positions of the positioning sensor in relation to a magnetic field;
determine respective directions of the environmental sensor with respect to the respective positions; and
correlate the sensor readings from the environmental sensor with corresponding directions of the environmental sensor; and
implementing a spindle through the center of the PCB, configured to allow rotation of the PCB about an axis defined by the spindle.

23. The method of claim 22, further comprising implementing an encasement surrounding the PCB and affixed to at least a portion of the spindle.

24. The method of claim 23, further comprising implementing a source of a magnetic field so as to allow the region at the edge of the PCB to pass through the magnetic field.

25. A method of operating a sensing apparatus at a controller, the method comprising:
obtaining one or more sensor readings from an environmental sensor at an instant of time, the environmental sensor configured to take omni-directional readings while implemented on a PCB configured to rotate about an axis within a plane, the PCB comprising one or more inductive elements positioned within a region at an edge of the PCB, wherein the one or more inductive elements are configured to generate electrical energy for the controller by passing through a magnetic field;
determining a relative position of a position sensor implemented on the PCB at the instant of time;
determining a relative position of the environmental sensor at the instant of time based on the determined relative position of the position sensor; and
correlating the one or more sensor readings with the relative position of the environmental sensor at the instant of time.

26. The method of claim 25, further comprising transmitting the correlated one or more sensor readings.

* * * * *